United States Patent [19]

Sirat

[11] Patent Number: 5,455,893
[45] Date of Patent: Oct. 3, 1995

[54] PROCESSING METHOD AND NEURONAL NETWORK STRUCTURE APPLYING THE METHOD

[75] Inventor: Jacques A. Sirat, Limeil-Brevannes, France

[73] Assignee: U.S. Philips Corporation, New York, N.Y.

[21] Appl. No.: 309,351

[22] Filed: Sep. 20, 1994

Related U.S. Application Data

[63] Continuation of Ser. No. 954,404, Sep. 29, 1992, abandoned, which is a continuation of Ser. No. 821,223, Jan. 9, 1992, abandoned, which is a continuation of Ser. No. 533,628, Jun. 5, 1990, abandoned.

[30] Foreign Application Priority Data

Jun. 9, 1989 [FR] France .................................. 89 07661

[51] Int. Cl.⁶ ..................................................... G06F 15/18
[52] U.S. Cl. ......................................................... 395/27
[58] Field of Search .................................. 395/23, 24, 27

[56] References Cited

U.S. PATENT DOCUMENTS 4,912,651  3/1990  Wood et al. ............................. 364/513

OTHER PUBLICATIONS

Hush et al., "Improving the Learning Rate of Back–Propagation with the Gradient Reuse Algorithm", IEEE International Conf. on Neural Networks, Jul. 24–27, 1988 pp. I-991-996.

Kung et al., "A Unifying Algorithm/Architecture for Neural Networks", *Proc. Int'l Conf. on Acoustics, Speech and Signal Processing*, v. 4, 1989, pp. 2565–2568.

Parker, "A Comparison of Algorithms for Neuron–Like Cells", *AIP Conference Proc. 151 Neural Networks for Computing*, 1986 pp. 327–332.

DE Rummelhart et al "Learning Internal Representations by Error Propagation", *Parallel Distributed Processing* vol. I (Formulations MIT 1986).

*Primary Examiner*—Robert W. Downs
*Attorney, Agent, or Firm*—David Schreiber

[57] ABSTRACT

The invention relates to a norms computation procedure applied within a neuronal network structure or a computer. It permits determination of the norm of the new synaptic coefficients without necessitating their explicit computation. To this end, the structure comprises a processing unit 10 which determines output potentials $y_k$ and variation $\Delta_k$, a storage unit 13 for the old and new norms and a computational unit 15 for the new norms. The latter are thus rapidly determined without needing to call the synaptic coefficients in memory. The procedure can be utilized with certain algorithms which necessitate a computation of norms.

4 Claims, 1 Drawing Sheet

PROCESSING METHOD AND NEURONAL NETWORK STRUCTURE APPLYING THE METHOD

This is a continuation of application Ser. No. 07/954,404, filed Sep. 29, 1992, now abandoned, which is a continuation of application Ser. No. 07/821,223, filed Jan. 9, 1992, now abandoned, which is a continuation of application Ser. No. 07/533,628, filed Jun. 5, 1990, now abandoned.

BACKGROUND OF THE INVENTION

The invention relates to a method of data processing applied in a neural network structure which method comprises:

determining potentials $y_k$ of output neurons k from states $x_l$ of receiving neurons 1, the potentials and the states being interrelated through synaptic coefficients $C_{kl}$;

determining quantities for obtaining increments for new synaptic coefficients $C_{kl}^{(n)}$) and calculating a norm $$m_k^{(n)} = \sum_l [C_{kl}^{(n)}]^2.$$

It further relates to a neuronal network structure which applies the method.

The neuronal networks find their applications in image processing, speech processing, etc.

The neuronal networks are made up of automata interconnected by synapses to which synaptic coefficients are assigned. They permit processing of problems which conventional sequential computers do with difficulty.

In order to process a given problem, the neuronal networks must first learn and to carry it out. This phase, called learning, makes use of examples.

For numerous algorithms, the results that should be obtained as output with these examples as input are generally known in advance. Initially, the neuronal network which is not yet adapted to the envisaged task will deliver erroneous results. An error $E^p$ indicative of a difference between the results obtained and those that ought to have been obtained is thus determined and, according to a modification criterion, the synaptic coefficients are modified in order to permit the neuronal network to learn the chosen example. This step is repeated over the batch of examples considered necessary for an adequate learning by the neuronal network.

A very common method for carrying out this modification, in the case of layered networks, is that of backpropagation of the gradient. To this end, the components of the gradient $g_j,L$ of the previous error $E^p$ (calculated on the last layer L) with respect to each potential $y_j,L$ of each neuron is determined. These components are then backpropagated within the neuronal network. The potentials $y_j,L$ are those quantities that are operated upon by a non-linear function, the non-linear character of this function being an essential aspect of neuronal networks in general.

This method is described, for example, in: D. E. Rumelhart, D. E. Hinton, and R. J. Williams, "Learning Internal Representation by Error Propagation", in D. E. Rumelhart, and J. L. McClelland (Eds), "Parallel Distributed Processing: Exploration in the Microstructure of Cognition", Vol. 1, Foundations, MIT Press (1986).

Backpropagation of the gradient is one of the numerous learning rules which can be put into the form:

$$C_{kl}^{(n)} = C_{kl} + \Delta_k x_l$$

where $C_{kl}$ and $C_{kl}^{(n)}$ are the old and new synaptic coefficients, respectively, as associated with the synaps between output neuron k and input neuron 1, $\Delta_k$, and is a variation which depends uniquely on the receiving neuron k, $x_l$ is the state of the input neuron 1.

These rules belong to the family of Hebbian rules. Some of these rules make use of the computation of the norm $m_k$ of the synaptic vector $C_k$ whose components $C_{kl}$ are the synaptic coefficients associated with a single output neuron k:

$$m_k = \sum_{l=1}^{N} (C_{kl})^2 \quad 1 \leq 1 \leq N.$$

These rules can be applied within parallel processing neuronal network structures. In this case, the organization of such structures permits rapid processing of the data, finishing up, at the end of the learning steps, with the computation of the new synaptic coefficients.

When the new synaptic coefficients have been computed, it is then possible to determine their respective norms for application in the learning rule under consideration.

Thus, the parallel processing neuronal network structure, initially provided to speed up processing, finds itself penalized by sequential steps which necessitate accessing of the synaptic coefficients in the memory and further arithmetic operations.

The problem to be solved is therefore how to compute the norms of the new synaptic coefficients without penalizing the execution speed of the processing structures.

SUMMARY OF THE INVENTION

The solution according to the invention relates to a method for computing the norm $$m_k^{(n)} = \sum_l (C_{kl}^{(n)})^2$$

of the new synaptic coefficients wherein the calculating the norm includes:

adding to a preceeding norm $m_k$ associated with previously obtained synaptic coefficient terms indicative of said related quantities.

As a result, memory accesses of the synaptic coefficients are avoided and the number of arithmetic operations, which would be at least equal to the number of input neurons in each case, is considerably reduced.

According, to the invention, computation of the new norm $m_k^{(n)}$ relating to the new synaptic coefficients that are associated with the output neuron k and the input neurons, each of which is indicated by a different value of the index "1", is done by adding terms to the previous value of the norm $m_k$ which consist of quantities that are available before the new synaptic coefficients themselves have been computed.

For instance the new norm m can be written:

$$m_k^{(n)} = \sum_l (C_{kl} + \Delta_k x_l)^2$$

that is:

$$m_k^{(n)} = \sum_l (C_{kl})^2 + 2\Delta_k \sum_l C_{kl} x + \Delta_k^2 \sum_l (x)^2$$

The term $$\sum_l C_{kl} x_l$$

corresponds to the processing effected by the neuronal network in order to compute the potential of output neuron k.

The term $$\sum_l (C_{kl})^2$$

is the old norm.

The term $$\sum_l (x_l)^2$$

is the norm by the vector of input neuron states.

According to the invention these various terms are either known or computed before the end of the step for computation of the new synaptic coefficients $C_{kl}^{(n)}$. Thus the norm of the vector having these coefficients as components can be determined without computing the new synaptic coefficients themselves but by combining the results of the steps already effected by the learning.

To this end, according to the invention the method comprises the following steps:

A—determination of the potential $y_k$ of the output neuron k such that:

$$y_k = \sum_l C_{kl} x_l$$

B₁—application of the learning steps and determination of the variation $\Delta_k$ to, B₂—determination of the norm $(x_l)^2$ of the states of the vector that has as components the input neurons, C—determination of the norm $m_k^{(n)}$ by performing the addition:

$$m_k^n = m_k + 2\Delta_k + (\Delta_k)^2 \sum_l (x_l)^2$$

where $m_k$ is the previous norm.

More generally, the learning rules may be formulated on the basis of the increment $\delta C_{kl}$ related to the synaptic coefficient $C_{kl}$ for obtaining the updated norm $m_k^{(n)}$. That is, the method according to the invention may includes the steps of:

determining first terms $(\delta C_{kl})^2$ for each $\delta C_{kl}$ for the associated synaptic coefficients relating to output neuron k;

determining second terms $2C_{kl} \, \delta C_{kl}$ relating to output neuron k;

adding the first terms and the second terms to the preceding norm $m_k$.

A programmed computer can implement the steps of the procedure.

This method can further be applied within a neuronal network structure equipped with means for determining the potential $y_k$ of output neuron k from states $x_l$ of transmitting associated with output neuron k through coefficients $C_{kl}$, and with means for effecting learning phases of the neuronal network by determining new synaptic coefficients $C_{kl}^{(n)}$. The computation of the new synaptic coefficients $C_{kl}^{(n)}$ and the computation of the norm of the vector having new synaptic coefficients as components are done substantially in parallel. That is, the computation of the new norm does not require the new synaptic coefficients to be available.

This structure comprises:

a processing unit which determines the potential $y_k$ of the receiving neuron by operating in parallel on all the input neurons 1 such that:

$$y_k = \sum_l C_{kl} x_l$$

and which determines the new synaptic coefficients $C_{kl}^{(n)}$ such that:

$$C_{kl}^{(n)} = C_{kl} + \Delta_k x_l \qquad (1)$$

where $\Delta_k$ is a variation associated with the output neuron k, a unit for storing the previous norm $m_k$ relating to the receiving neuron k, a unit for computing the norm $$\sum_l (x_l)^2$$

of the vector of states $x_l$, a computational unit which determines the new norm $m_k^{(n)}$ on the basis of the norm $$\sum_l (x_l)^2$$

and the increment $\Delta_k$, and the potential of the output neuron $y_k$ coming from the processing unit, such that:

$$m_k^n = m_k + 2\Delta_k + (\Delta_k)^2 \sum_l (x_l)^2.$$

Thus, the new synaptic coefficients on one hand and the new norm value associated with output neuron k on the other hand are calculated independently of one another. The method according to the invention and the structure for implementing the method according to the invention can also be extended to include parallel calculations with regard to a set of receiving neurons, each indicated by a different value of the parameter k as used above. That is, if the potentials $y_k$, k=1, . . . ,K are calculated by operating in parallel on the input neurons, and if the variations $\Delta_k$, k=1, . . . ,K are calculated in parallel, the new norm values $m_k$, k=1, . . . ,K then can be calculated in parallel as well, with regard to the index k. Thus, the parallelism in the computation of the new synaptic coefficients is advantageously used in the calculation of the new norm values. Even when the processing is effected serially the method reduces the processing time.

BRIEF DESCRIPTION OF THE DRAWINGS

The invention will be explained hereinafter with reference to a drawing with FIGS. 1A and 1B given by way of example, which show the diagrams of the neuronal network structures equipped with means permitting determination of the new norms.

BRIEF DESCRIPTION OF THE PREFERRED EMBODIMENTS

Figure 1A:
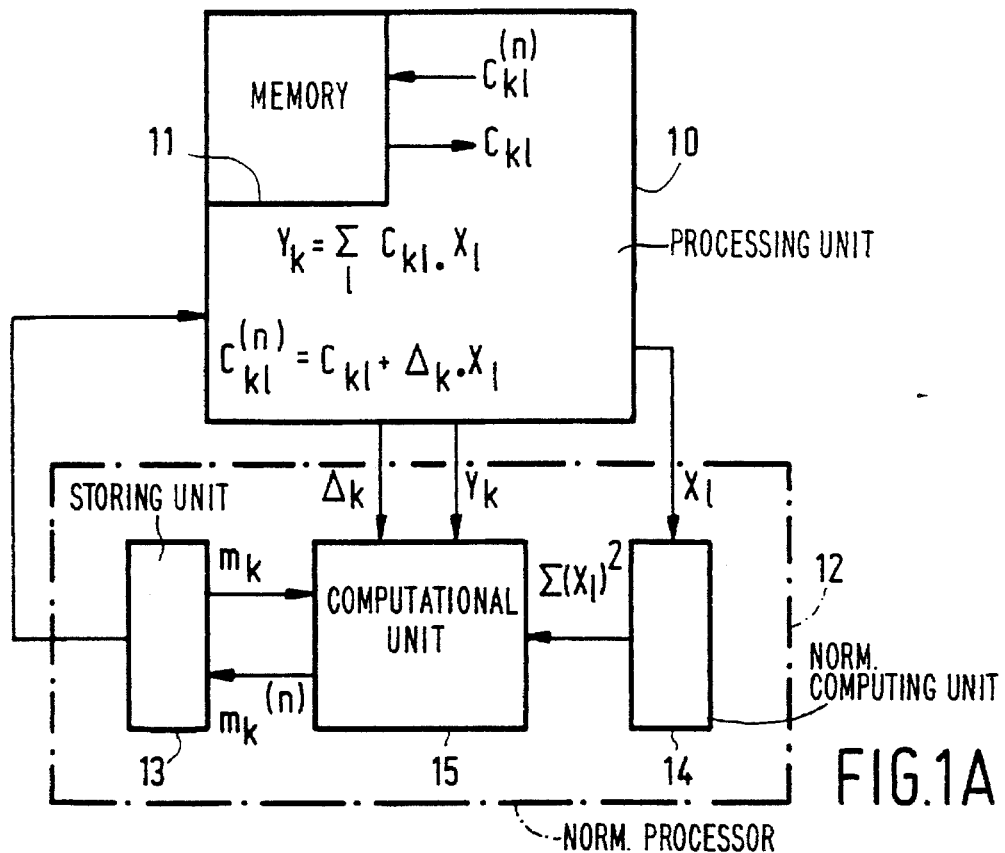

The neuronal network structure of the FIG. 1A comprises a processing unit 10 equipped with a memory 11 of synaptic coefficients. The processing unit 10 effects all the operations necessary for the functioning of a neuronal network, i.e.:

computing the potentials of the input neurons $y_k$ on the basis of the states of the output neurons $x_l$ and the synaptic coefficients $C_{kl}$ according to:

$$y_k = \sum_l C_{kl} x_l$$

computing of the new states of output neurons $y^{(n)}_k$ by application of a nonlinear function F:

$$y^{(n)}_k = F(y_k),$$

applying a learning method such as, for example, the back-propagation of the gradient which permits determination of the change in synaptic coefficients to be effected so that the neuronal network adapts, with the aid of examples, to the task envisaged, such that:

$$C_{kl}^{(n)} = C_{kl} + \Delta_k x_l,$$

wherein $C_{kl}^{(n)}$ is the new synaptic coefficient which replaces the old synaptic coefficient $C_{kl}$, $x_l$ are the states of the input neurons, and wherein $\Delta_k$ is a variation, relating to the output neuron k, which is determined in the course of the learning phase. The variation, for examples, takes account of the old norm $m_k$.

In the course of the usual processing effected in a neuronal network, the processing unit 10 can provide quantities $\Delta_k$, $y_k$ and $x_l$ for a given receiving neuron k.

According to the invention these quantities are transmitted to a norm processor 12. This comprises:

a unit 13 for storing the norms relating to all receiving neurons, that is, for all values of the index k in the synaptic coefficients $C_{kl}$, a unit 14 for computing the norm $$\sum_l (x_l)^2$$

relating to the states of the input neurons, and a computational unit 15 which receives:

the old norm $m_k$ from the storage unit 13 the norm of the $$\sum_l (x_l)^2$$

from the computational unit the potential $y_k$ of the output neuron k and the variation $\Delta_k$ unique to this output neuron k.

The computational unit 15 determines the new norm $m_k^{(n)}$ by carrying out the multiplications and additions as presented in the following expression:

$$m_k^n = m_k + 2\Delta_k + (\Delta_k)^2 \sum_l (x_l)^2.$$

In the storage unit 13, this new norm $m_k^{(n)}$ overwrites the old norm $m_k$, for use in the following cycle (connection 16).

This norm processor 12 can be used to implement all the above mentioned Hebbian type learning rules that involves the norm $m_k$ norm computation to effect learning.

Figure 1B:
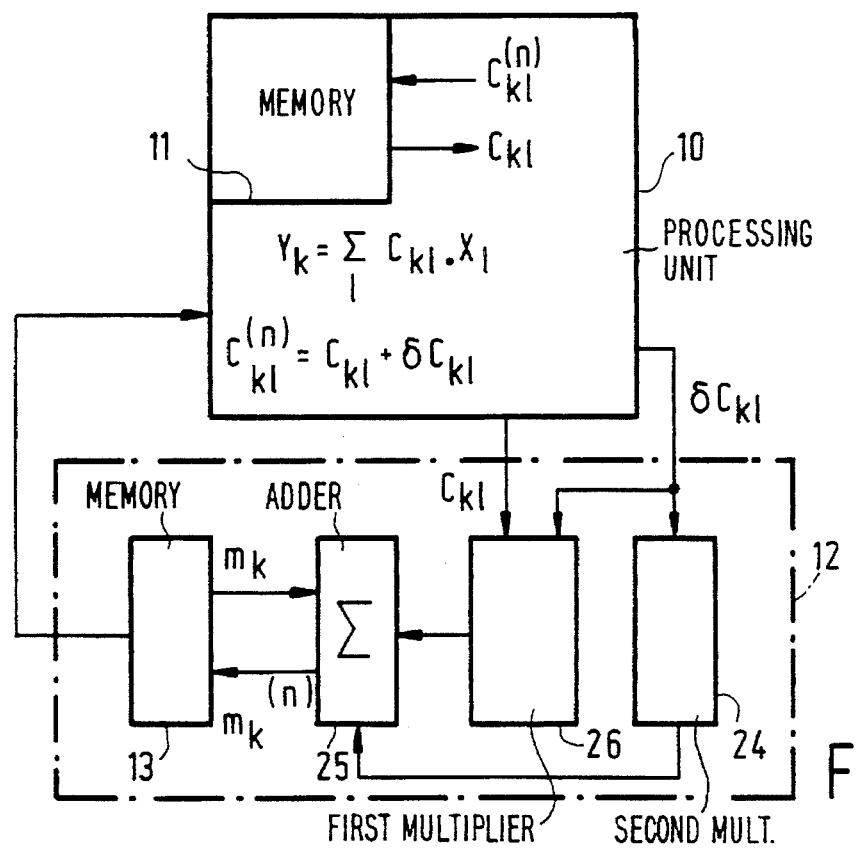

A more general embodiment is represented in FIG. 1B, wherein the norm processor 12 receives the synaptic coefficients $C_{kl}$ and the corresponding updating $\delta C_{kl}$ for a particular output neuron k. The norm processor may comprise:

a memory 13 for storing the norm values $m_k$, k=1, ..., K related to all output neurons k=1, ..., K;

a first multiplier 24 for determining quantities $(\delta C_{kl})^2$;

a second multiplier 26 for determining products $C_{kl}\delta C_{kl}$;

an adder 25 that is coupled to the memory 13 for receiving the stored norm, and that is coupled to the multiplicators 24 and 26 for receiving $(\delta C_{kl})^2$ and $C_{kl}\delta C_{kl}$, respectively, for a fixed value of index k.

Thus the new norm $m_k^{(n)}$ is calculated according to:

$$m_k^{(n)} = m_k + \sum_l 2C_{kl}\delta C_{kl} + \sum_l (\delta C_{kl})^2.$$

The result $m_k^{(n)}$ is thereupon stored in memory 13, thereby replacing $m_k$. It should be noted that the second multiplicator may calculate $2C_{kl}\delta C_{kl}$ directly or may feed its result twice to adder 25.

The FIGS. 1A and 1B are presented in the form of neuronal network structures formed by functional blocks. It is possible to integrate all of the functions to be effected into a computer. In this case the invention relates to a computer programmed to effect the learning of a neuronal network by applying the norm computation method according to the invention.

I claim:

1. A neuronal network structure comprising a plurality of interconnected neurons; means for information propogation among the neurons, wherein the information propogation from transmitting neurons to a receiving neuron is determined by values of synaptic coefficients assigned to neuron interconnections; each neuron comprising:

memory means for storing the synaptic coefficients and a norm value of a vector with values of the synaptic coefficients as components of the vector;

a processor connected to the memory for, during execution of a sequence of learning cycles, determining increments for updating the values of coefficients obtained in a previous cycle, the increments being determined through a learning rule that involves the norm value;

an adder connected to the processor for adding terms that are indicative of the increments to the norm value in order to calculate a new norm value associated with the updated values of the coefficients, and the processor storing in the memory the updated values to be used as the synaptic coefficients and for storing the new norm value to be used in a following cycle.

2. A neuronal network structure as in claim 1, wherein the processor performs a calculation according to:

$$y_k = \sum_l [C_{kl} x_l],$$

$C_{kl}$ being the synaptic coefficient associated with the communication from a particular transmitting neuron 1 to the receiving neuron k at the beginning of a particular cycle;

$x_l$ being a state of the transmitting neuron 1 at the end of the particular cycle;

$y_k$ being a potential of the receiving neuron k at the end of the particular cycle;

wherein the processor computes, according to the learning rule, the increment for the synaptic coefficient $C_{kl}$ as being a product of a variation $\Delta_k$, depending on $y_k$, and of the state $x_l$;

wherein the learning rule involves the norm value $m_k$ that at the beginning of the particular cycle is equal to:

$$m_k = \sum_l [(C_{kl})^2];$$

and wherein the processor further includes:

a multiplier for calculating further values of the following quantities: a further product of $y_k$ and $\Delta_k$; $(\Delta_k)^2$;

$$\left\{ \sum_l x_l^2 \right\};$$

another product of $(\Delta_k)^2$ and $$\left\{ \sum_l x_l^2 \right\};$$

the multiplier being connected to the adder for providing the further values and the adder supplying the new norm value $m_k(\text{new})$ according to:

$$m_k(\text{new}) = m_k + 2\Delta_k y_k + (\Delta_k)^2 \left( \sum_l x_l^2 \right).$$

3. A neuronal network structure as in claim 1 provided with a multiplier, connected to the processor for receiving synaptic coefficient $C_{kl}$, associated with transmitting neuron 1 and receiving neuron k, and for receiving the increment $dC_{kl}$ for the synaptic coefficient $C_{kl}$, for calculating the terms $C_{kl} dC_{kl}$ and $[dC_{kl}]^2$, and for providing the terms to the adder.

4. A neuronal network structure as in claim 1 including a computer programmed to determine the increments and the new norm value.

* * * * *